(12) United States Patent
Van De Groes et al.

(10) Patent No.: US 11,372,343 B2
(45) Date of Patent: Jun. 28, 2022

(54) ALIGNMENT METHOD AND ASSOCIATED METROLOGY DEVICE

(71) Applicant: ASML NETHERLANDS B.V., Veldhoven (NL)

(72) Inventors: Henricus Martinus Johannes Van De Groes, Tiel (NL); Johannes Hubertus Antonius Van De Rijdt, Gemert (NL); Marcel Pieter Jacobus Peeters, Weert (NL); Chien-Hung Tseng, Zhubei (TW); Henricus Petrus Maria Pellemans, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/435,115

(22) PCT Filed: Feb. 14, 2020

(86) PCT No.: PCT/EP2020/053853
§ 371 (c)(1),
(2) Date: Aug. 31, 2021

(87) PCT Pub. No.: WO2020/178003
PCT Pub. Date: Sep. 10, 2020

(65) Prior Publication Data
US 2022/0100107 A1    Mar. 31, 2022

(30) Foreign Application Priority Data
Mar. 1, 2019   (EP) ..................... 19160190

(51) Int. Cl.
*G03F 9/00*   (2006.01)

(52) U.S. Cl.
CPC .......... *G03F 9/7046* (2013.01); *G03F 9/7011* (2013.01)

(58) Field of Classification Search
None
See application file for complete search history.

(56) References Cited

U.S. PATENT DOCUMENTS

| 6,952,253 | B2 | 10/2005 | Lof et al. |
| 6,961,116 | B2 | 11/2005 | Den Boef et al. |
| 7,265,364 | B2 | 9/2007 | Teunissen et al. |

(Continued)

FOREIGN PATENT DOCUMENTS

| EP | 1628164 | 2/2006 |
| WO | 2009078708 | 6/2009 |

(Continued)

OTHER PUBLICATIONS

International Search Report and Written Opinion issued in corresponding PCT Patent Application No. PCT/EP2020/053853, dated May 27, 2020.

(Continued)

*Primary Examiner* — Michelle M Iacoletti
(74) *Attorney, Agent, or Firm* — Pillsbury Winthrop Shaw Pittman LLP (57) ABSTRACT

A method of aligning a substrate within an apparatus. The method includes determining a substrate grid based on measurements of a plurality of targets, each at different locations on a substrate. The determining includes repetitions of updating the substrate grid after each measurement of a target, and using the updated grid to align a measurement of a subsequent target.

20 Claims, 4 Drawing Sheets

(56) References Cited

U.S. PATENT DOCUMENTS

| | | |
|---|---|---|
| 7,646,471 B2 | 1/2010 | Teunissen et al. |
| 7,701,577 B2 | 4/2010 | Straaijer et al. |
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,797,554 B2 | 8/2014 | Straaijer |
| 8,823,922 B2 | 9/2014 | Den Boef |
| 2007/0296960 A1 | 12/2007 | Den Boef et al. |
| 2008/0198380 A1 | 8/2008 | Straaijer et al. |
| 2009/0091722 A1 | 4/2009 | Egashira |
| 2010/0233600 A1 | 9/2010 | Den Boef et al. |
| 2010/0328655 A1 | 12/2010 | Den Boef |
| 2011/0026032 A1 | 2/2011 | Den Boef et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2012/0242940 A1 | 9/2012 | Nagata et al. |
| 2013/0162996 A1 | 6/2013 | Straaijer et al. |
| 2013/0308142 A1 | 11/2013 | Straaijer |
| 2015/0153656 A1 | 6/2015 | Van Der Sanden et al. |
| 2015/0261097 A1 | 9/2015 | Mathijssen et al. |
| 2016/0161863 A1 | 6/2016 | Den Boef et al. |
| 2016/0370717 A1 | 12/2016 | Den Boef et al. |

FOREIGN PATENT DOCUMENTS

| | | |
|---|---|---|
| WO | 2009106279 | 9/2009 |
| WO | 2016102127 | 6/2016 |

OTHER PUBLICATIONS

European Search Report issued in corresponding European Patent Application No. 19160190, dated Oct. 9, 2019.

ALIGNMENT METHOD AND ASSOCIATED METROLOGY DEVICE

CROSS REFERENCE TO RELATED APPLICATIONS

This application is the U.S. national phase entry of PCT Patent Application No. PCT/EP2020/053853, which was filed on Feb. 14, 2020, which claims the benefit of priority of European Patent Application No. 19160190.5, which was filed on Mar. 1, 2019, and which is incorporated herein in its entirety by reference.

FIELD

The present invention relates to an alignment method for aligning a substrate, and in particular such an alignment method in relation to metrology applications in in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC), sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process. An alignment process may initially be performed, to align a substrate within the metrology tool such that targets thereon can be located. It would be desirable to improve upon such alignment processes.

SUMMARY

In a first aspect of the invention, there is provided a method of aligning a substrate within an apparatus comprising: determining a substrate grid based on measurements of a plurality of targets, each at different locations on a substrate; wherein said determining step comprises repetitions of: updating said substrate grid after each measurement of a target, using the updated grid to align a measurement of a subsequent target.

Other aspects of the invention comprise a metrology device operable to perform the method of the first aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
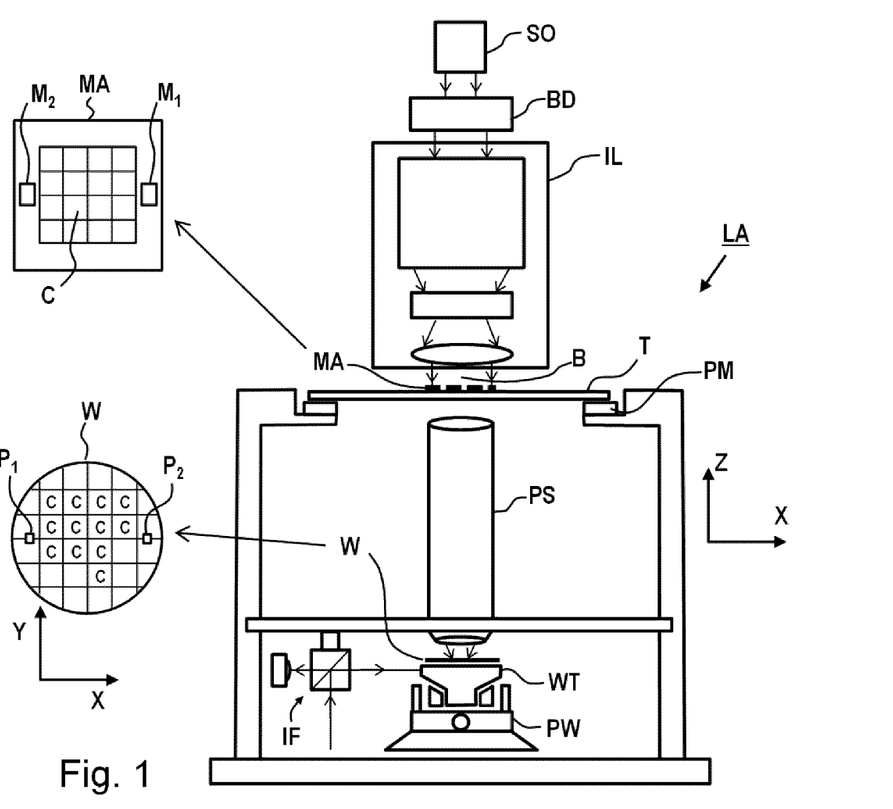
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
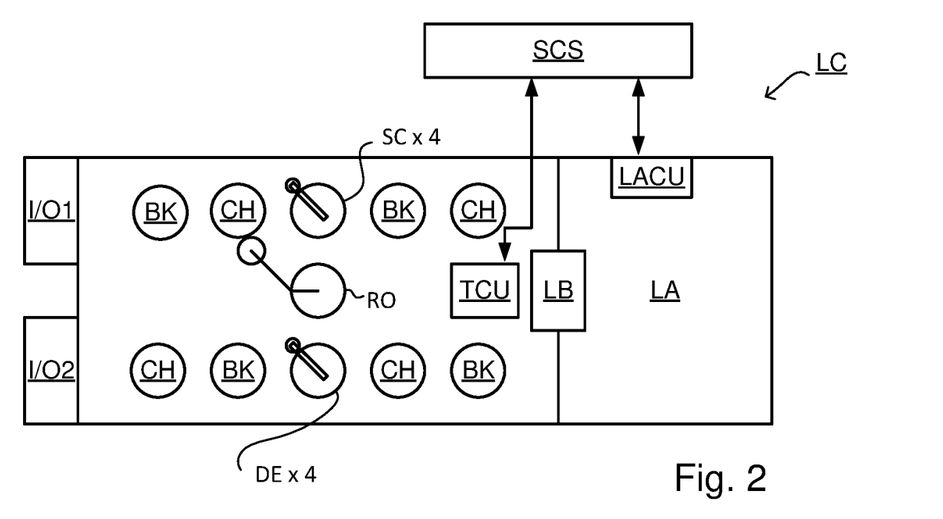
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
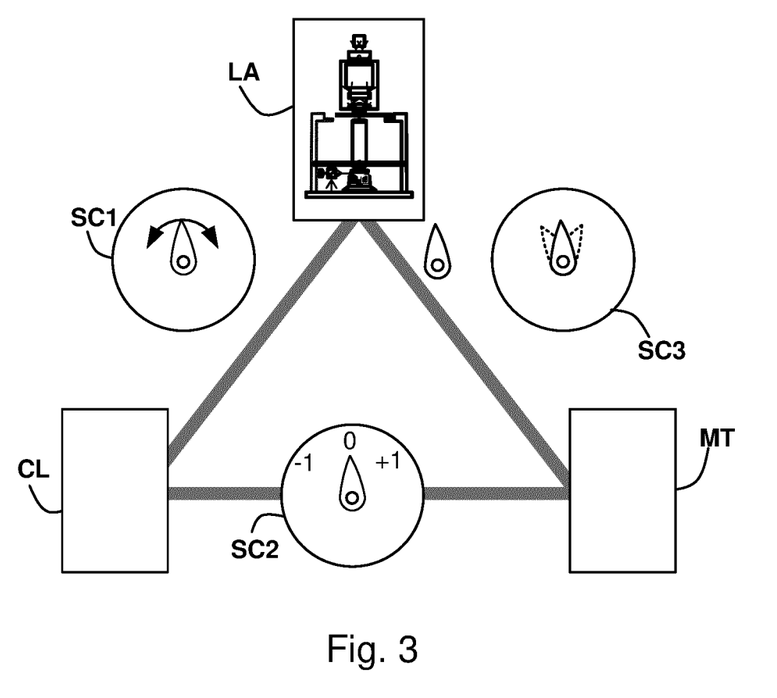
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent applications Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

Figure 4:
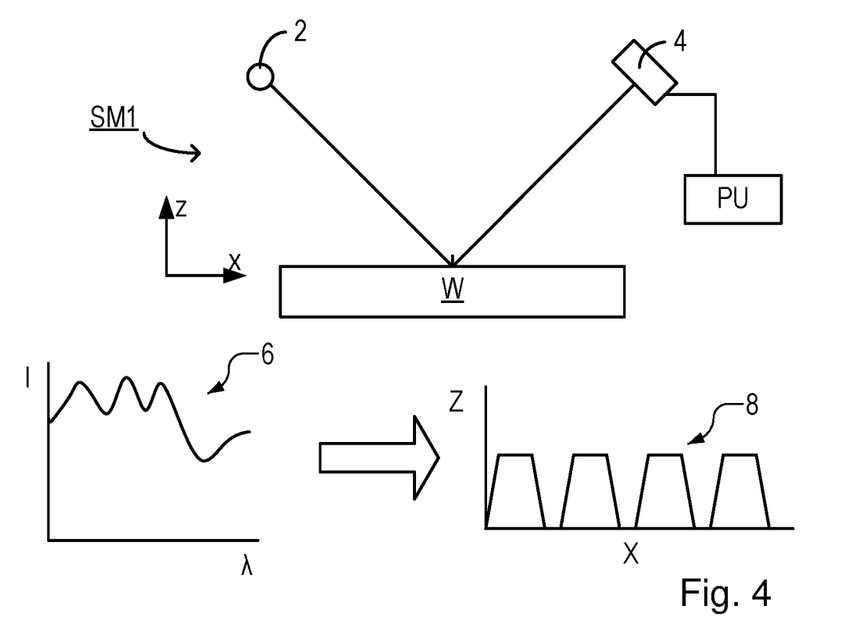
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1, incorporated herein by reference in its entirety.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 5:
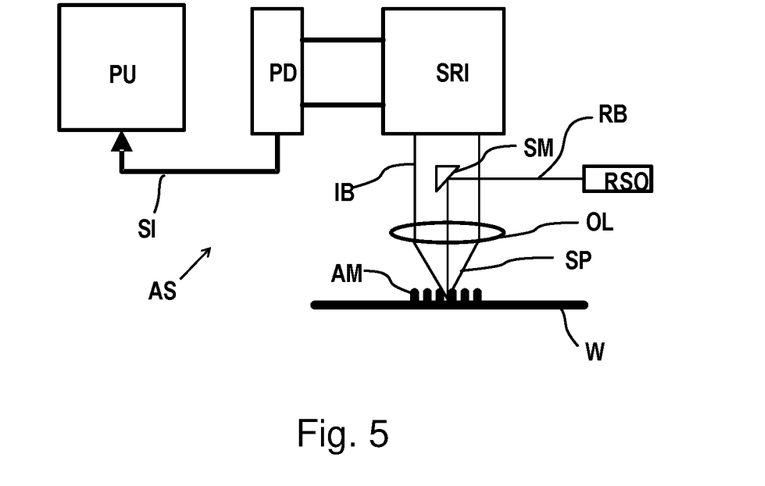
FIG. 5 depicts a schematic overview of an alignment sensor apparatus which may comprise a radiation source according to embodiments of the invention.

FIG. 5 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam TB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Figure 6:
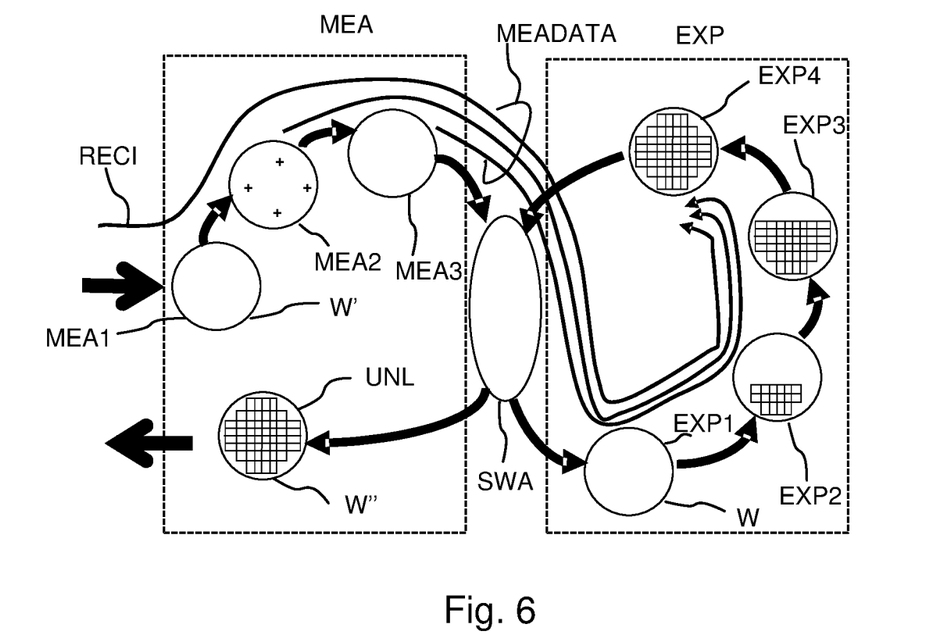
FIG. 6 illustrates the steps for exposing target portions (e.g. dies) on a substrate, in the example of a dual stage type lithographic apparatus.

FIG. 6 illustrates the steps to expose target portions (e.g. dies) on a substrate, or wafer, in the example of a dual stage type lithographic apparatus. Within a dotted box on the left hand side of FIG. 6 process steps are indicated that are performed at a measurement station MEA, while a dotted box on the right hand side of FIG. 6 indicates process steps performed at an exposure station EXP. Each of the measurement station and exposure station comprises a (separate) substrate support on which a substrate may be supported. From time to time, one of these substrate supports will be at the exposure station EXP, while the other is at the measurement station MEA.

At step MEA1, a new substrate W' is loaded onto the substrate support which is at the measurement station MEA, while another substrate W has already been loaded into the exposure station EXP. The substrates W, W' are processed in parallel (simultaneously) at the measurement station MEA and at the exposure station EXP in order to increase the throughput of the lithographic apparatus.

At step MEA2 measurements are performed in the measurement station MEA to determine and record a position of the substrate W' relative to the substrate support, on which the substrate W' is provided, in a plane of the substrate support (i.e. X-Y plane). In addition, a "wafer grid" may be measured (using, for example, an alignment sensor), which accurately describes the shape of the substrate W' and the positions of marks across the substrate, including any distortion relative to a nominal rectangular grid of marks (in the plane of the substrate, i.e. X-Y plane).

At step MEA3 a topography of the substrate W' (perpendicular to X-Y plane of substrate, i.e. along Z-axis) as a function of X-Y position is measured using, for example, a level sensor resulting in a substrate (or wafer) height map. This substrate height map is, for example, used to achieve accurate focusing of the exposed pattern at the exposure station EXP.

The measured wafer position, wafer grid and height map are added to recipe data RECI so that a complete set of exposure and measurement data MEADATA can be input to the exposure station EXP.

At step SWA the substrate W and the substrate W' are swapped, so that the measured substrate W' becomes the substrate in the exposure station EXP. In this example the swapping is performed by exchanging the respective substrate supports, so that the substrates remain accurately positioned on their respective supports to preserve relative alignment between the respective substrate supports and substrates.

Before exposing the substrate W, the relative position between projection system PS and substrate support is determined to be able to make use of the data measured at steps MEA2, MEA3 for the position of the substrate on the substrate support in control of the exposure steps. At step EXP1 alignment between reticle and substrate support is performed using mask alignment marks M1, M2. In steps EXP2, EXP3 and EXP4 scanning motions and radiation pulses are applied at successive target locations across the substrate W, in order to perform the exposure of a number of patterns.

After exposure of the substrate W, the substrate W is unloaded from the substrate support at step UNL. There the substrate, which is now labeled W", will undergo photoresist processing, etching and/or other semiconductor processing steps.

The skilled person will know that the above description is a simplified overview of a number of very detailed steps involved in one example of a real manufacturing situation. For example rather than measuring the position of the wafer in a single process, often there will be separate processes of coarse and fine measurements The alignment methods described above, are not only performed as a pre-exposure step within a scanner, but also prior to a measurement within a metrology tool such as that illustrated in FIG. 4. Described herein will be an improved alignment strategy with an emphasis on substrate (or wafer) alignment within a metrology tool, although it will be appreciated that the concepts may be readily extended to pre-exposure alignment within a scanner.

To align a substrate during a measurement (e.g., an overlay measurement) in a metrology device, a known substrate alignment process may comprise two steps, a coarse align step and fine align step, to reach a final accuracy requirement. The alignment process may be performed using dedicated alignment sensor, or using any of the sensors/optics otherwise comprised within the metrology device for its main metrology functions.

The alignment process may further comprise (immediately prior to the coarse align) a substrate pre-alignment step to initially adjust substrate rotation, for example, to within +/−1 mrad accuracy. During both coarse align and fine align, a substrate grid (or wafer grid) is constructed and updated by measuring the positions of multiple marks. The coarse alignment step is used to determine a coarse alignment grid to a sufficient accuracy for it to be used to calculate the expected positions of the fine alignment marks. From measurement of the final alignment marks at these expected position, in the fine alignment stage, the fine substrate alignment grid is constructed.

Substrate alignment is a one-time operation per substrate and consumes up to about 3 seconds; the majority of this time being taken by the fine alignment step (coarse alignment may take less than a second). A final alignment accuracy may be expected to be, for example, less than +/−1.5 μm.

Two major drawbacks of this current two-step (coarse and fine) substrate alignment is its limited accuracy and impact on throughput. Accuracy is limited by a number of factors. For example, the alignment accuracy depends on the exact moment that the sensor captures a picture from which the marker position is determined. Furthermore, due to dynamic behavior (e.g. drift) there can be an error of +/−3 μm (e.g., due to hysteresis in the alignment task). Drift can result in the desired target position deviating from the real target position causing measurement errors (MA). Differential vibration (dynamics) can also be a large error contributor, which is not recorded by the encoder. Dynamics between the encoder and the sensor tip (point of interest POI) are not taken into account in stage positioning.

To address these issues, an alignment method is proposed which replaces the fine alignment step with a step which determines a substrate grid based on the overlay (or other parameter of interest) measurements which are to be performed in any case. Two embodiments of such an alignment method will be described.

The proposed approach utilizes target-to-position offset (TPO) information obtained from each metrology target measurement (e.g., each measurement of the parameter of interest). TPO comprises the error or residual between an expected target position (as calibrated) and the detected target position on the detector (e.g., camera) in an actual measurement. The camera measurement can either be the mDBO dark-field images, or for the IDM case, the target images taken by YS alignment sensor.

The target measurements for determining the detected target position, and therefore the target-to-position offset, may be obtained by dark-field imaging, for example in an overfilled ADI (after develop inspection) measurement (e.g., of overlay or focus). Alternatively, the target measurements may each comprise an additional measurement using the metrology device's alignment sensor (if it has one) in an underfilled AEI (after etch inspection) measurement. In the latter case, TPO information can be derived from a determination of the measurement spot to target misalignment. This may be already measured as part of an existing control strategy, so that this misalignment can be corrected for in a subsequent AEI measurement. More specifically, in an underfilled AEI measurement it is possible to determine the TPO offset by taking an additional image using the alignment optical system almost simultaneously with or immediately subsequent to the actual AEI measurement. The image retrieved from the Alignment optical system can be used to determine the exact position of a target (by the target dimensions and or shape as seen by the optical system) and thereby determine the TPO.

The targets may be, for example, overlay targets or focus targets, depending on the parameter of interest being measured. In an embodiment, the targets may comprise micro-diffraction based overlay (μDBO) or micro-diffraction based focus (μDBF) targets. Such targets may be measured using an "overfilled" measurement method, where the measurement spot is larger than the target, such that the target is comprised entirely within the measurement spot during a measurement. Such a measurement method may determine intensity values for different regions of interest (e.g., relating to different grating structures comprised within the target which can all be measured in one image), and determine the parameter of interest from the intensity values of diffraction orders. In particular differences in corresponding higher diffraction orders can be used to determine a parameter of interest. The intensity values may be obtained using dark field metrology, examples of which can be found in international patent applications WO 2009/078708 and WO 2009/106279 (hereby incorporated by reference in their entirety). Further developments of the technique have been described in patent publications US20110027704A, US20110043791A and US20120242940A. The contents of all these applications are also incorporated herein by reference. Diffraction-based overlay or focus using dark-field detection of the diffraction orders enables overlay or focus measurements on smaller targets. As these targets can be smaller than the illumination spot, they may be surrounded by product structures on a substrate. These methods are well known and will not be described in further detail here.

Figure 7:
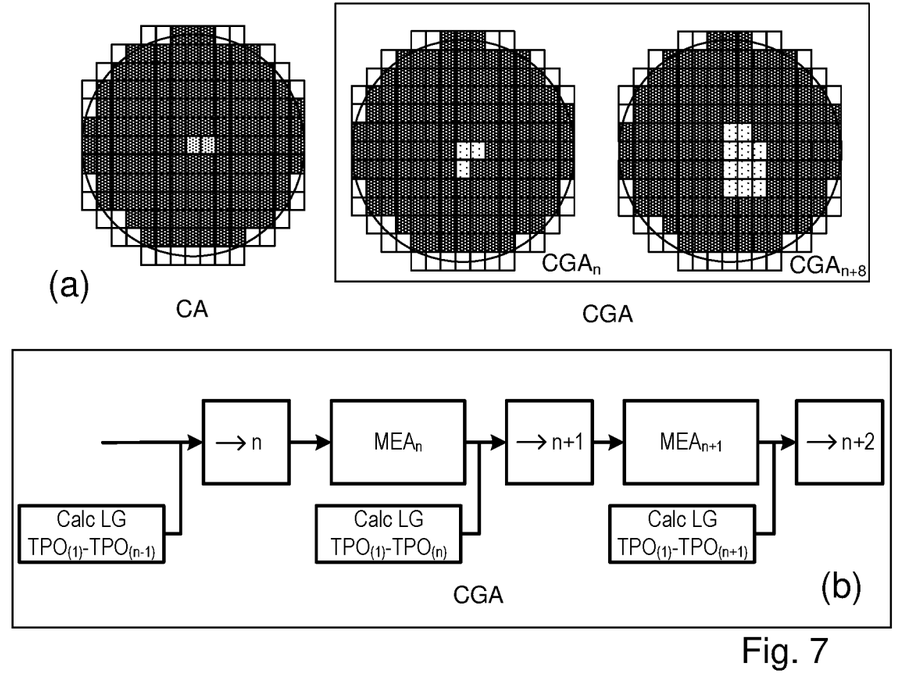
FIG. 7 conceptually illustrates an alignment method according to a first embodiment of the invention.

FIG. 7 illustrates a first embodiment, where FIG. 7(a) conceptually illustrates the overall method at a high level, and FIG. 7(b) is a flow diagram describing the proposed high-order cumulative grid alignment CGA stage. The method comprises a coarse align CA by a known method (e.g., by performing a known coarse alignment strategy such as COarse Substrate Alignment COWA). Such a method may be performed, by measuring alignment marks on two centrally located fields. The coarse alignment is sufficiently accurate to position the parameter of interest (e.g., overlay or focus) targets within the sensor field of view.

Following the coarse alignment CA, instead of a fine alignment step, a high-order cumulative grid alignment CGA stage is proposed. The CGA method is a cumulative method for calculating a substrate grid based on measurements of successive metrology targets and a determined target-to-position offset from each of these measurements. As such the substrate grid is an increasingly expanding local substrate grid, which increases at least in terms of coverage as more targets at an increasing variety of locations are measured. It is further proposed, in an embodiment, that the cumulative substrate grid also expands in terms of the number of fitting parameters as more target positions are included in the calculation. By way of example, the substrate grid may begin as a 4 parameter grid, and increase over time to 10 parameters or higher. As the number of fitting parameters increases, both intra-field and inter-field parameters may be included. In this definition, the term "local" is defined with respect to the next target (and/or next field comprising the next target) to be measured. For example, "local" may mean that the target being measured is in the same field, an adjacent field, no more than two fields apart, or no more than three fields apart from the nearest measured target, for which the measurement has contributed in the determination of the cumulative substrate grid.

FIG. 7(b) illustrates a few steps of the proposed method, starting from an intermediate stage immediately following measurement of a target n−1. Based on this measurement, as indicated by step Calc LG $TPO_{(1)}$ to $TPO_{(n-1)}$, the target-to-position offset TPO for this target n−1 is determined and the high order local grid updated for all targets measured to this time (e.g., target 1 to target n−1 inclusive). Following this, the metrology device sensor moves to target n and a measurement $MEA_n$ is performed on the target n (e.g., an overlay or focus measurement). The move step is based on the updated substrate grid, such that this grid is used in locating the next target. Based on this measurement $MEA_n$, a TPO value for target n is determined and the cumulative substrate grid is again updated with the new value (step Calc LG $TPO_{(1)}$ to $TPO_{(n)}$). These steps are then repeated for subsequent measurements. The result is a cumulative (local) substrate grid which has a small coverage at the beginning of the substrate being measured, as indicated by the three lighter shaded fields in the substrate representation $CGA_n$. The substrate coverage of the cumulative (local) substrate grid increases for each target measured, as indicated by the lighter shaded fields in the later substrate representation $CGA_{n+8}$, following 8 further measurements.

Figure 8:
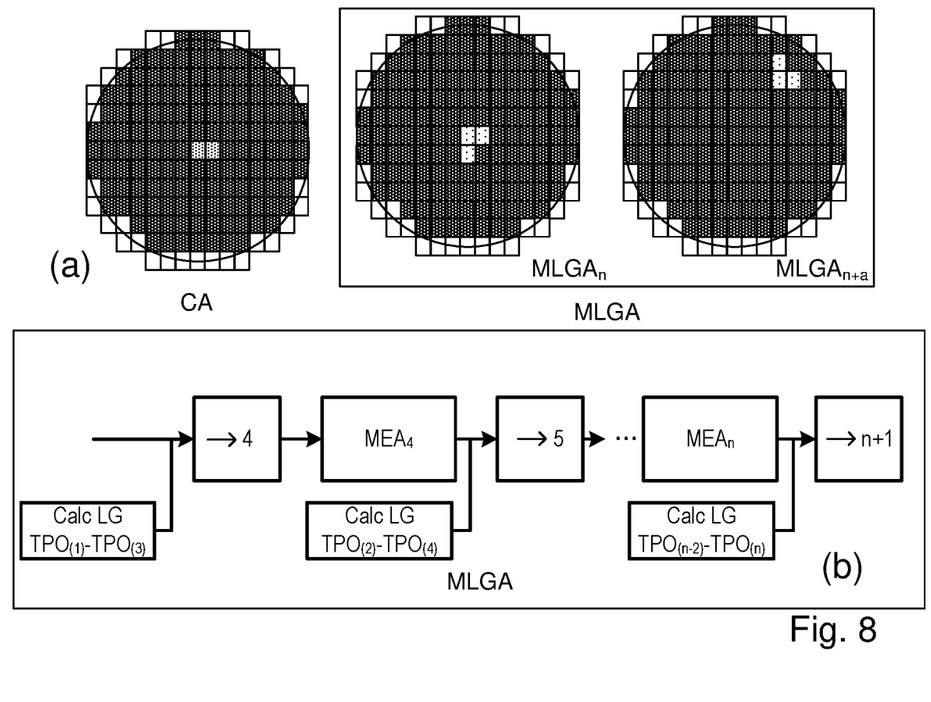
FIG. 8 conceptually illustrates an alignment method according to a second embodiment of the invention.

A second embodiment is illustrated by FIG. 8. This embodiment is similar to that illustrated by FIG. 7, in that both construct a substrate grid from TPO information obtained from overlay (or other parameter of interest) measurements. However, instead of constructing an ever expanding, cumulative high-order substrate grid, a moving local substrate grid (e.g., a 6 parameter grid) is calculated as the measurement moves to different regions of the substrate.

FIG. 8(a) is an equivalent conceptual illustration to that of FIG. 7(a). Once again the alignment comprises an initial coarse align CA, which is sufficient to position the metrology targets in the sensor field of view. Following this, the moving local grid align MLGA process determines a local grid from the same number of measurements obtained locally to the next measurement to be made. This moving coverage of the local grid is indicated by the three lighter fields in the substrate representation $MLGA_n$ and $MLGA_{n+a}$.

FIG. 8(b) describes a few example steps of the MLGA method. The TPO information from the previous few (e.g., the previous 2 or more, here 3) target positions. In this figure, the flow starts from an intermediate stage immediately following measurement of target 3. Based on this measurement, as indicated by step Calc LG $TPO_{(1)}$ to $TPO_{(3)}$, the target-to-position offset TPO for this target 3 is determined and a local substrate grid is calculated based on these three targets. Following this, the metrology device sensor moves to target 4 and a measurement is performed $MEA_4$ on the target 4 (e.g., an overlay or focus measurement). The move step is based on the updated substrate grid, such that this grid is used in locating the next target. Based on this measurement $MEA_4$, a TPO value for target 4 is determined and a new local substrate grid is calculated (step Calc LG $TPO_{(2)}$ to $TPO_{(4)}$) based only on targets 2 to 4. These steps are then repeated for subsequent measurements.

The coverage of the grid moves along with the routing and the number of fitting parameters remains the same (e.g., 6 parameter). Optionally, in this embodiment, the 6 parameter substrate grid may comprise only linear terms. Since fine alignment is skipped, there is reduction in substrate overhead. As the grid always constructed in close proximity to the next measurement, it reflects local print error, and a higher position accuracy can be achieved.

As before, the term "local" for this embodiment is defined with respect to the next target (and/or next field comprising the next target) to be measured. For example, "local" may mean that the target being measured is in the same field, an adjacent field, no more than two fields apart, or no more than three fields apart from the nearest measured target, for which the measurement has contributed in the determination of the moving local substrate grid. As such, the moving local grid may always relate to (e.g., be measured from targets within) a moving window of a fixed number of targets and/or fields local to the next target to be measured.

The example in FIG. 8(b) describes an immediate grid update method, where positioning for the nth target is based on a substrate grid determined from the immediately preceding few (e.g., 3) targets; i.e., it includes TPO information from the immediately preceding target n−1. However, it may be more convenient for there to be a delayed substrate grid update; e.g., the substrate grid is based on the previous few measurement only up to target n−2 (i.e., up to the target measured two or three targets prior to the target being measured). Similarly, in the cumulative substrate grid embodiment the update after each measurement may be delayed by one or more targets (e.g., such that the cumulative substrate grid used for aligning to a target n, is based on measurements of target 1 to target n−2 only).

The proposed alignment strategies should improve accuracy without yield loss, and possibly resulting in a yield gain. Additionally, there should be no need to realign in time (drift compensation). As such, as the substrate grid is updated for each target, a realignment is no longer necessary. Alignment drift compensation, more specifically for a low frequency phenomenon/component, is done on the fly.

While the above description is described in terms of metrology tool alignment, the method is equally applicable to alignment measurement in the scanner, and as such applies to all exposure/scanner or metrology/inspection tools which use markers/targets at a certain (known) locations on the substrate.

Further embodiments are disclosed in the subsequent numbered clauses:
1. A method of aligning a substrate within an apparatus comprising: determining a substrate grid based on measurements of a plurality of targets, each at different locations on a substrate; wherein said determining step comprises repetitions of:
   updating said substrate grid after each measurement of a target, and
   using the updated grid to align a measurement of a subsequent target.
2. A method as defined in clause 1, comprising: determining a target-to-position offset value for each target based on each measurement, the target-to-position offset value describing a difference between a measured target position and an expected target position for that measurement; and determining said substrate grid from said target-to-position offset values.
3. A method as defined in clause 1 or 2, wherein said substrate grid is updated cumulatively, in terms of at least coverage, after each measurement.
4. A method as defined in clause 3, wherein said substrate grid is also updated cumulatively in terms of the number of fitting parameters used to describe the substrate grid.
5. A method as defined in clause 3 or 4, wherein said substrate grid is described using at least one higher order term.
6. A method as defined in clause 1 or 2, wherein said substrate grid is a moving local substrate grid determined from a fixed number of said targets within a moving window local to said subsequent target.
7. A method as defined in clause 6, wherein the fixed number of targets numbers fewer than 6.
8. A method as defined in clause 6, wherein the fixed number of targets numbers 3.
9. A method as defined in clause 6, 7 or 8, wherein said substrate grid is described using only linear terms.
10. A method as defined in any preceding clause, wherein the method comprises an initial coarse alignment step based on at least one alignment target, said coarse alignment step being sufficient to locate at least one of said plurality of targets for one of said measurements.
11. A method as defined in any preceding clause, wherein the updated grid used to align the next measurement includes an update based on the target measured immediately prior.
12. A method as defined in any of clauses 1 to 10, wherein the updated grid used to align the next measurement does not include an update based on the target measured immediately prior, the update being delayed by at least one target.
13. A method as defined in any preceding clause, wherein the apparatus comprises a metrology apparatus for determining a parameter of interest relating to a lithographic process.
14. A method as defined in clause 13, wherein said parameter of interest is one of overlay or focus.
15. A method as defined in clause 13 or 14, wherein said targets are metrology targets formed by said lithographic process for determining said parameter of interest, such that each of said measurements performed in said step of determining a substrate grid is used in said determination of said parameter of interest.
16. A method as defined in any of clauses 13 to 15, wherein each measurement is a scatterometery measurement, said metrology targets each comprising at least one grating.
17. A method as defined in clause 16, wherein each measurement is a dark field scatterometery measurement, and each of said targets is smaller and comprised substantially within a measurement spot during each of said measurements.
18. A metrology device comprising a substrate holder for holding a substrate, a detector, and a processor;
wherein said processor is operable to performed the method of any of clauses 13 to 17, to align said substrate during said measurement of a parameter of interest.
19. The metrology device of clause 18, being further operable to perform each of said measurements of the plurality of targets.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A method of aligning a substrate within an apparatus, the method comprising:
   determining a substrate grid based on measurements of a plurality of targets, each at different locations on a substrates, wherein the determining comprises repetitions of:
   updating the substrate grid after each measurement of a target, and
   using the updated grid to align a measurement of a subsequent target.

2. The method as claimed in claim 1, comprising:
   determining a target-to-position offset value for each target based on each measurement, the target-to-position offset value describing a difference between a measured target position and an expected target position for that measurement; and
   determining the substrate grid from the target-to-position offset values.

3. The method as claimed in claim 1, wherein the substrate grid is updated cumulatively, in terms of at least coverage, after each measurement.

4. The method as claimed in claim 3, wherein the substrate grid is described using at least one higher order term.

5. The method as claimed in claim 1, wherein the substrate grid is a moving local substrate grid determined from a fixed number of the targets within a moving window local to the subsequent target.

6. The method as claimed in claim 5, wherein the fixed number of targets numbers fewer than 6.

7. The method as claimed in claim 5, wherein the fixed number of targets numbers 3.

8. The method as claimed in claim 5, wherein the substrate grid is described using only linear terms.

9. The method as claimed in claim 1, further comprising an initial coarse alignment step based on at least one alignment target, the coarse alignment step being sufficient to locate at least one of the plurality of targets for one of the measurements.

10. The method as claimed in claim 1, wherein the updated grid used to align the next measurement includes an update based on the target measured immediately prior.

11. The method as claimed in claim 1, wherein the updated grid used to align the next measurement does not include an update based on the target measured immediately prior, the update being delayed by at least one target.

12. The method as claimed in claim 1, wherein the apparatus comprises a metrology apparatus for determining a parameter of interest relating to a lithographic process.

13. The method as claimed in claim 12, wherein the targets are metrology targets formed by the lithographic process for determining the parameter of interest, such that each of the measurements performed in the determining a substrate grid is used in the determination of the parameter of interest.

14. The method as claimed in claim 12, wherein each measurement is a scatterometery measurement, and the metrology targets each comprise at least one grating.

15. A metrology device comprising:
   a substrate holder for holding a substrate,
   a detector, and
   a processor configured to perform the method of claim 12, to align said substrate during said measurement of a parameter of interest.

16. A non-transitory medium having computer-readable instructions therein, the instructions, when executed by a processor, are configured to cause the processor to at least:
   determine a substrate grid for alignment of a substrate within an apparatus based on measurements of a plurality of targets, each at different locations on the substrate, wherein the determination comprises repetitions of:
   updating of the substrate grid after each measurement of a target, and
   use of the updated grid to align a measurement of a subsequent target.

17. The medium as claimed in claim 16, wherein the instructions are further configured to cause the processor to:
   determine a target-to-position offset value for each target based on each measurement, the target-to-position offset value describing a difference between a measured target position and an expected target position for that measurement; and
   determine the substrate grid from the target-to-position offset values.

18. The medium as claimed in claim 16, wherein the substrate grid is updated cumulatively, in terms of at least coverage, after each measurement.

19. The medium as claimed in claim 16, wherein the substrate grid is a moving local substrate grid determined from a fixed number of the targets within a moving window local to the subsequent target.

20. The medium as claimed in claim 16, wherein the updated grid used to align the next measurement includes an update based on the target measured immediately prior.

* * * * *